United States Patent [19]

Boruta

[11] Patent Number: 5,786,266

[45] Date of Patent: Jul. 28, 1998

[54] MULTI CUT WAFER SAW PROCESS

[75] Inventor: Mirek Boruta, Castro Valley, Calif.

[73] Assignee: LSI Logic Corporation, Milpitas, Calif.

[21] Appl. No.: 714,624

[22] Filed: Sep. 16, 1996

Related U.S. Application Data

[63] Continuation of Ser. No. 233,630, Apr. 26, 1994, abandoned, which is a continuation-in-part of Ser. No. 225,904, Apr. 12, 1994, abandoned.

[51] Int. Cl.⁶ .................................................. H01L 21/304
[52] U.S. Cl. ............................ 438/462; 438/465; 83/861; 83/875; 125/12; 225/2
[58] Field of Search .......................... 83/39, 49, 56, 83/862, 863, 875, 877, 879, 880, 882, 886, 887, 861; 225/2, 96; 437/226, 227; 438/460, 462, 465, 119, 386, 387; 125/12, 13.01, 16.01

[56] References Cited

U.S. PATENT DOCUMENTS

| | | | |
|---|---|---|---|
| 4,355,457 | 10/1982 | Barlett et al. | 437/226 X |
| 4,851,371 | 7/1989 | Fisher et al. | 437/226 |
| 5,000,811 | 3/1991 | Campanelli | 156/264 |
| 5,128,282 | 7/1992 | Ormond et al. | 437/227 X |

FOREIGN PATENT DOCUMENTS

| | | |
|---|---|---|
| 0 032 801 | 7/1981 | European Pat. Off. . |
| 0 228 863 | 7/1987 | European Pat. Off. . |
| 0 438 127 A2 | 7/1991 | European Pat. Off. . |
| 12563 | 1/1979 | Japan ............ 437/227 |
| 24572 | 2/1979 | Japan ............ 437/226 |
| 107039 | 7/1982 | Japan ............ 437/227 |
| 154639 | 8/1985 | Japan ............ 437/226 |
| 60-154639 | 8/1985 | Japan . |
| 298138 | 12/1987 | Japan ............ 437/227 |
| 276276 | 11/1988 | Japan ............ 437/226 |
| 225131 | 9/1989 | Japan ............ 437/227 |
| 4-008469 | 1/1992 | Japan ............ 83/39 |
| 4-042949 | 2/1992 | Japan ............ 437/226 |
| 4-254352 | 9/1992 | Japan ............ 437/226 |

OTHER PUBLICATIONS

IBM Technical Disclosure Bulletin, vol. 34, No. 12, May 1, 1992, pp. 311–312, Method of Preventing Damage to Integrated Circuit Chips During Wafer Dicing.

*Primary Examiner*—Clark F. Dexter
*Attorney, Agent, or Firm*—Townsend and Townsend and Crew LLP

[57] ABSTRACT

A method of cutting a plate-like wafer, particularly a semiconductor wafer, while removing a deposited material from along a scribe line. The deposited material having a width generally greater than the width of the saw blade. The method includes making one scribing cut to one side of the scribe line, making a second scribing cut to the other side of the scribe line, and making a severing cut along the scribe line to dice the wafer.

7 Claims, 6 Drawing Sheets

MULTI CUT WAFER SAW PROCESS

This application is a continuation of Ser. No. 08/233,630 filed Apr. 26, 1994, now abandoned, which is a continuation-in-part of Ser. No. 08/225,904 filed Apr. 12, 1994, now abandoned.

BACKGROUND OF THE INVENTION

The present invention relates generally to a method for cutting a plate-like material and, more specifically, to a method of cutting a semiconductor wafer that contains metal deposits along a scribe line.

In the manufacture of semiconductor devices, multiple semiconductor devices are typically arranged on one surface of a round silicon wafer. It is known to separate or dice the multiple semiconductor devices with a diamond coated saw blade along the scribe line.

However, semiconductor wafers may have test patterns deposited along the scribe line on the surface of the wafer. These test patterns may be composed of metal and have a width wider than the width of the standard diamond saw blade. After the wafer is cut, metal may remain on the edge of the cut and metal slivers may subsequently become dislodged. The slivers can interfere with the operation of the semiconductor device and thus affect the reliability of the device.

SUMMARY OF THE INVENTION

The present invention provides a method for cutting semiconductor wafers that contain test patterns on the scribe lines without producing slivers. The present invention uses multiple scribing cuts to remove the excess test pattern material, followed by a severing cut to dice the semiconductor wafer along the scribe line and remove any test pattern material that may remain.

In an embodiment of the present invention, the test patterns are removed by scribing cuts made with a beveled or V-shaped blade. The semiconductor wafer is then severed along the scribe line with a standard flat surface saw blade.

A further understanding of the nature and advantages of the present invention may be realized by reference to the remaining portions of the specification and the drawings.

BRIEF DESCRIPTION OF THE DRAWINGS

FIG. 1A is a cross sectional view of a semiconductor wafer before being cut;

FIG. 1B is a cross sectional view of a semiconductor wafer after being cut;

FIG. 2A is a cross sectional view of a semiconductor wafer before being cut;

FIG. 2B is a cross sectional view of a semiconductor wafer after a first scribing cut;

FIG. 2C is a cross sectional view of a semiconductor wafer after a second scribing cut;

FIG. 2D is a cross sectional view of a semiconductor wafer after a third severing cut;

FIG. 3A is a cross sectional view of a semiconductor wafer before being cut;

FIG. 4A is a cross sectional view of a semiconductor wafer before being cut;

FIG. 4B is a cross sectional view of a semiconductor wafer after a first scribing cut;

FIG. 4C is a cross sectional view of a semiconductor wafer before a second severing cut;

FIG. 4D is a cross sectional view of a semiconductor wafer after a second severing cut;

FIG. 5A is a cross sectional view of a semiconductor wafer cut before being cut;

FIG. 5B is a cross sectional view of a semiconductor wafer cut after being cut;

FIG. 6A is a cross sectional view of a semiconductor wafer with a test pattern is deposited along a scribe line and a mounting tape applied to the underside of the semiconductor wafer;

FIG. 6B is a cross sectional view of a semiconductor wafer after it is partially severed according to the method of FIGS. 2A–2D;

FIG. 6C is a cross sectional view of a semiconductor wafer broken along the scribe line.

DESCRIPTION OF SPECIFIC EMBODIMENTS

The examples of specific embodiments of the present invention describe making first, second, and third cuts in the semiconductor wafer. It should be understood, however, that these designations are for convenience, and should not be taken to mean that the cuts must be performed in any defined order. Similarly, the number of cuts can be more or less than shown in the specific embodiments described herein.

Dicing Method According to the Prior Art

Figure 1A:
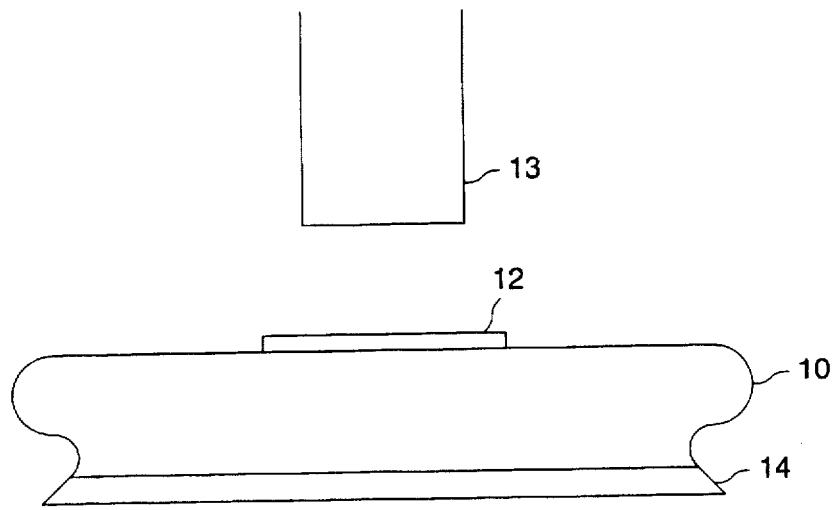
FIGS. 1A and 1B show a method of cutting a semiconductor wafer according to the prior art.
Figure 1B:
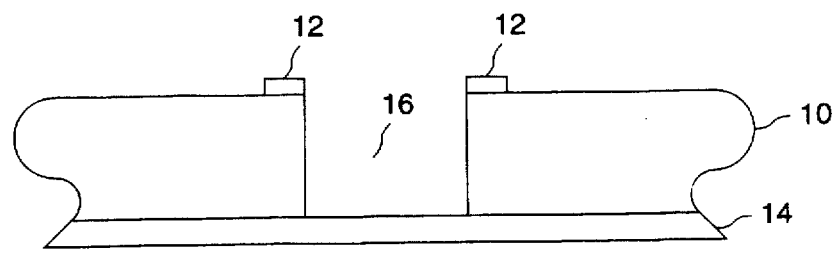

FIGS. 1A and 1B show a prior art method of cutting a semiconductor wafer. In FIG. 1A, a semiconductor wafer 10 has a metal test pattern 12 deposited on the surface of the wafer. The test pattern may be deposited along an area known as a scribe line. A scribe line or street is the area between semiconductor devices where a diamond saw blade 13 will sever or dice the semiconductor wafer. The saw blade will generally have a width less than the width of the scribe line. Typically the saw blade has a blade thickness of 1.2 to 1.6 mil.

The semiconductor wafer is shown having a layer of mounting tape 14 taped to the underside of the wafer. The mounting tape is attached to a frame (not shown) and secures the wafer die both during and after the cutting process. The saw blade does not sever the mounting tape.

FIG. 1B shows the semiconductor wafer after it has been cut according to the prior art. The cut severs the semiconductor wafer in the middle of the scribe line creating a groove 16. As the width of the test patterns may be wider than the saw blade, two portions of test pattern 12 remain on the top surface of the wafer near groove 16. These portions of the test pattern may become dislodged as slivers and affect the reliability of the packaged semiconductor device. This is especially true when the test pattern is composed of a conducting material because the slivers may short out the semiconductor device.

Multi Cut Dicing Method According to the Present Invention

In an embodiment of the present invention shown in FIGS. 2A through 2D, two scribing cuts are used to eliminate portions of the test pattern and a third severing cut dices the wafer, removing whatever portion, if any, of the test pattern that remains.

Figure 2A:
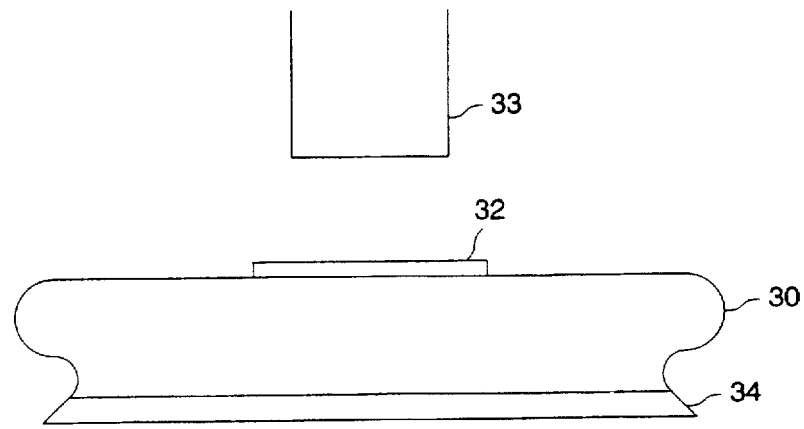
FIGS. 2A through 2D show a method of cutting a semiconductor wafer according to an embodiment of the present invention.

In FIG. 2A, a semiconductor wafer 30 has a metal test pattern 32 deposited along the scribe line on the surface of the wafer. A standard flat surface saw blade 33 is used to cut the wafer. A mounting tape 34 is taped to the underside of the semiconductor wafer and attached to a frame (not shown).

Figure 2B:
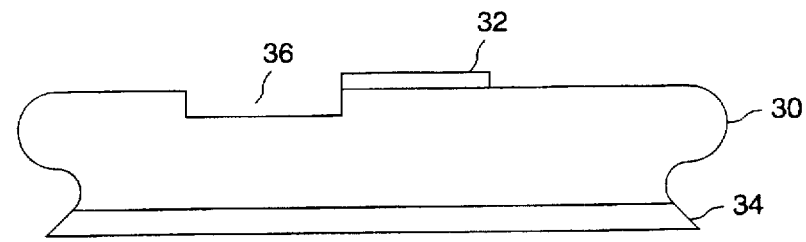
Figure 2C:
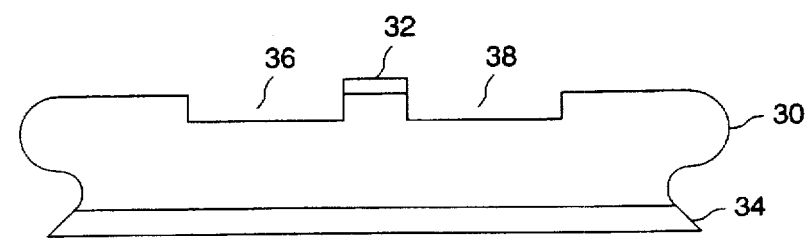

A first scribing cut is made in the semiconductor wafer on one side of the scribe line to remove a first portion of test pattern 32. FIG. 2B shows the wafer after the first scribing cut which leaves a groove 36. Then a second scribing cut is made in the semiconductor wafer on the other side of the scribe line to remove a second portion of test pattern 32. The second cut leaves a groove 38 and is shown in FIG. 2C. Neither the first or second scribing cuts sever the wafer and are only intended to remove portions of the test pattern outside the width of the saw blade. Thus, the first and second cuts may be superficial.

Figure 2D:
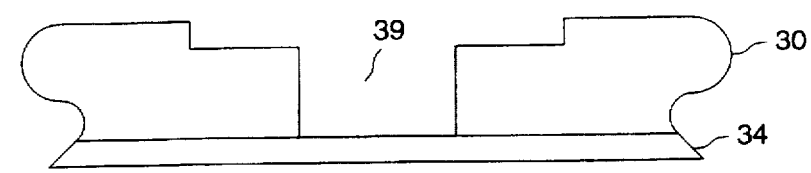

A third severing cut is then made along the center of the scribe line to sever the wafer. FIG. 2D shows the wafer after the third cut which leaves a groove 39. The cut severs the wafer but does not sever mounting tape 34. Although the description and figures show the third severing cut passing through the wafer, the present invention may also be practiced where the third cut does not sever the wafer. The wafer may then be broken along the scribe line in any number of ways known to those skilled in the art.

The following are an example of machine settings for practicing the above-described multi cut dicing method:

|  | cut depth | max. feed speed |
| --- | --- | --- |
| first cut | 3 mils | 0.5 in./second |
| second cut | 3 mils | 0.5 in./second |
| third cut | 18.5 mils | 2.5 in./second |

These settings are for a standard semiconductor wafer and may be modified for other uses.

In another embodiment of the present invention shown in FIGS. 3A through 3D, two scribing cuts are made with a beveled or V-shaped saw blade to remove the test pattern. A third severing cut is made with a standard flat surface blade to sever the wafer.

Figure 3A:
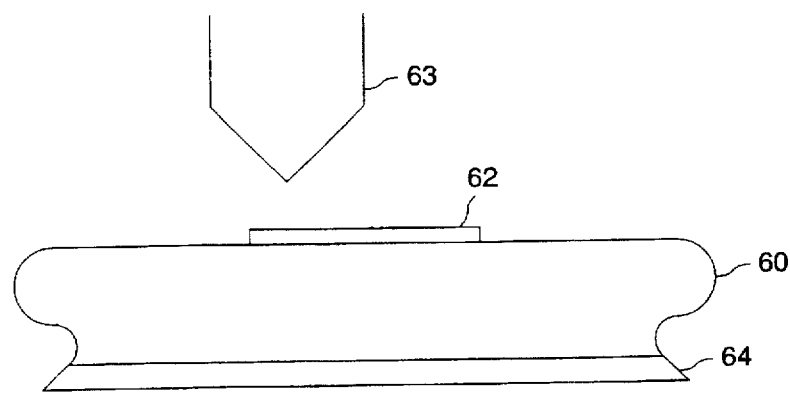
FIGS. 3A though 3D show a method of cutting a semiconductor wafer according to an embodiment of the present invention.

In FIG. 3A, a semiconductor wafer 60 has a metal test pattern 62 deposited along the scribe line on the surface of the wafer. A V-shaped saw blade 63 is used to scribe the wafer along the scribe line. A mounting tape 64 is taped to the underside of the semiconductor wafer.

Figure 3B:
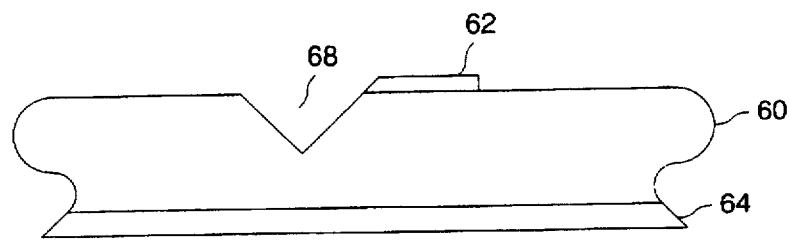
FIG. 3B is a cross sectional view of a semiconductor wafer after a first scribing cut.
Figure 3C:
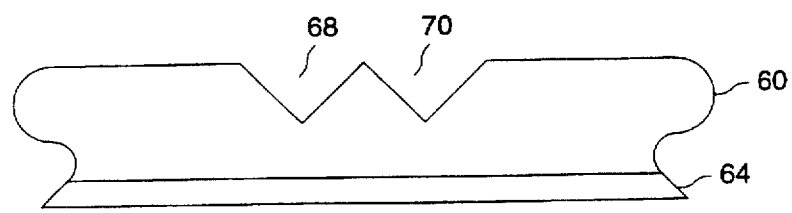
FIG. 3C is a cross sectional view of a semiconductor wafer after a second scribing cut.

A first scribing cut is made in the semiconductor wafer along one half of the scribe line to remove a first portion of test pattern 62. FIG. 3B shows the wafer after the first scribing cut which leaves a groove 68. Then a second scribing cut is made in the semiconductor wafer along the other half of the scribe line to remove a second portion of test pattern 62. The second scribing cut leaves a groove 70 and is shown in FIG. 3C. Neither the first or second scribing cuts sever the wafer and are only intended to remove the test pattern.

Figure 3D:
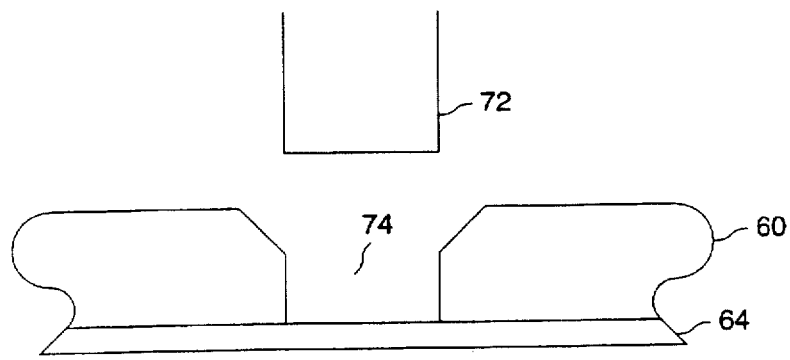
FIG. 3D is a cross sectional view of a semiconductor wafer after a third severing cut.

A third severing cut is then made along the scribe line to sever the wafer. FIG. 3D shows the wafer after the third severing cut. The third cut may be made with a standard flat surface saw blade 72 leaving a groove 74. The third cut severs the wafer but does not sever mounting tape 64. This embodiment has the advantage of producing beveled top edges along the scribe line. Beveled edges help reduce semiconductor wafer chipping.

In another embodiment of the present invention shown in FIGS. 4A through 4D, one scribing cut is made with a V-shaped saw blade to remove the test pattern. The saw blade has a thickness greater than the width of the test pattern. A second severing cut is made with a flat surface saw blade to sever the wafer.

Figure 4A:
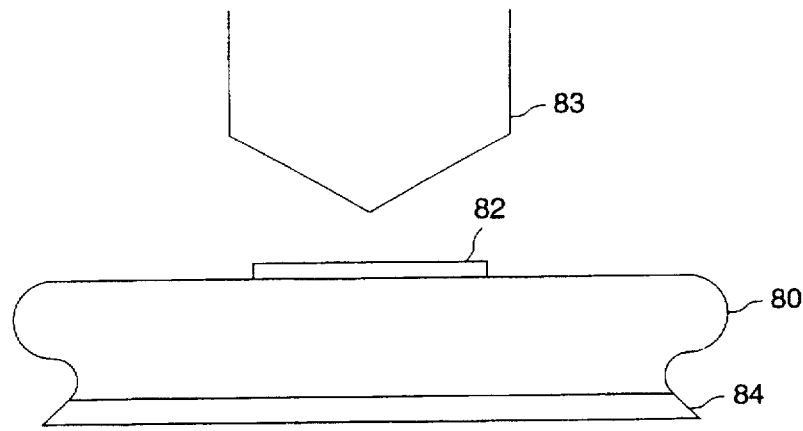
FIGS. 4A through 4D show a method of cutting a semiconductor wafer according to an embodiment of the present invention.

In FIG. 4A, a semiconductor wafer 80 has a metal test pattern 82 deposited along the scribe line on the surface of the wafer. A V-shaped saw blade 83 is used to scribe the wafer along the scribe line. The saw blade has a thickness greater than the width of the test pattern so only one cut is needed to scribe the test pattern. A mounting tape 84 is taped to the underside of the semiconductor wafer.

Figure 4B:
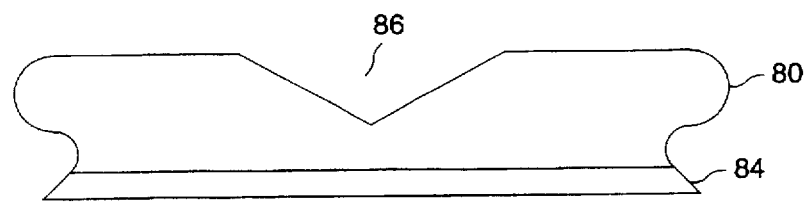
Figure 4C:
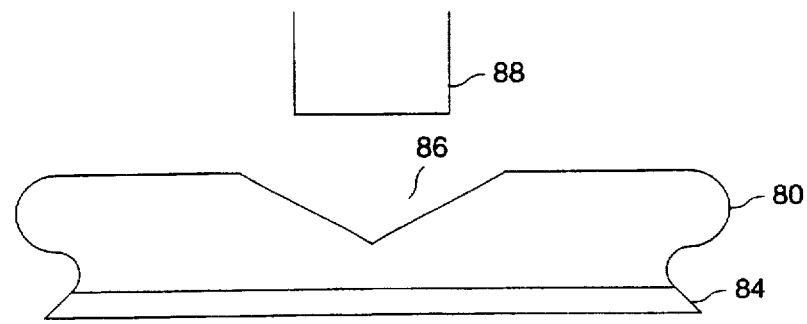
Figure 4D:
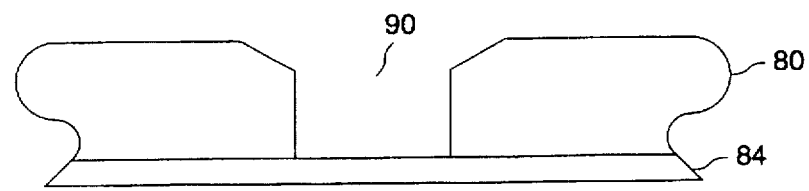

A first scribing cut is made in the semiconductor wafer to remove test pattern 82. FIG. 4B shows the wafer after the first scribing cut which leaves a groove 86. Then a second severing cut is made along the scribe line to dice the wafer. FIG. 4C shows a flat surface saw blade 88 may be used to make the second severing cut. FIG. 4D shows the wafer after the second severing cut which leaves a groove 90. The second severing cut severs the wafer but does not sever mounting tape 84. This embodiment also has the advantage of producing beveled top edges along the scribe line which may help reduce semiconductor wafer chipping.

Single Cut Dicing Method According to the Present Invention

The present invention may also be practiced where a single scribing/severing cut is made with a V-shaped saw blade which has a thickness greater than the width of the test pattern. This method is shown in FIGS. 5A and 5B.

Figure 5A:
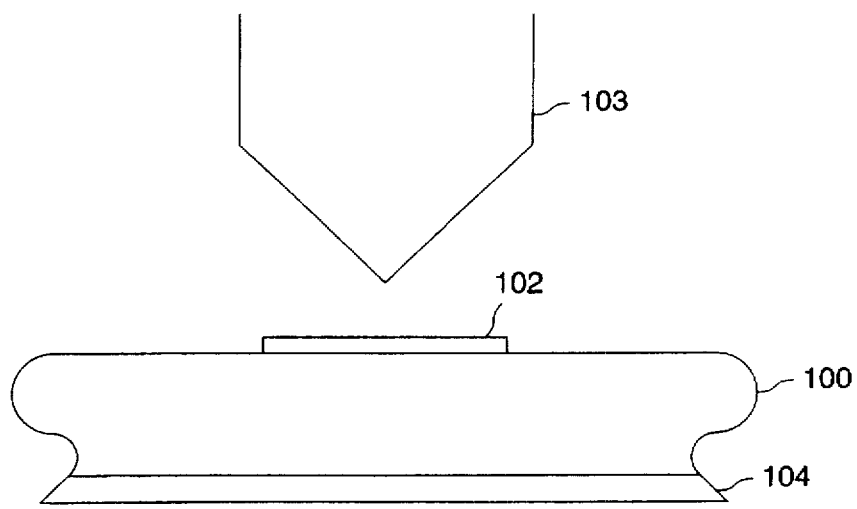
FIGS. 5A and 5B show a method of cutting a semiconductor wafer according to an embodiment of the present invention.
Figure 5B:
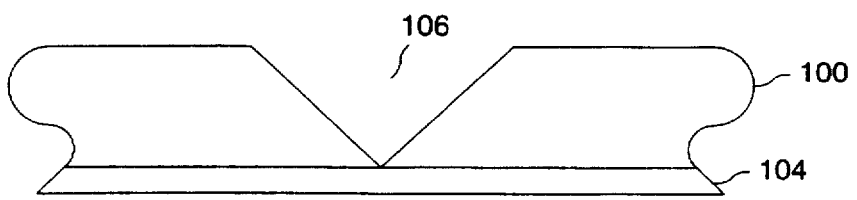

In FIG. 5A, a semiconductor wafer 100 has a metal test pattern 102 deposited along the scribe line on the surface of the wafer. A V-shaped saw blade 103 is used to scribe and sever the wafer along the scribe line. As the saw blade has a thickness greater than the width of the test pattern, the severing cut can also scribe the test pattern. A mounting tape 104 is taped to the underside of the semiconductor wafer.

A first scribing/severing cut is made in the semiconductor wafer to remove test pattern 102 and sever the wafer. FIG. 4B shows the wafer after the first scribing/severing cut which leaves a groove 106. The scribing/severing cut severs the wafer but does not sever mounting tape 104. This embodiment also has the advantage of producing beveled top edges along the scribe line which may help reduce semiconductor wafer chipping.

Conclusion

Figure 6A:
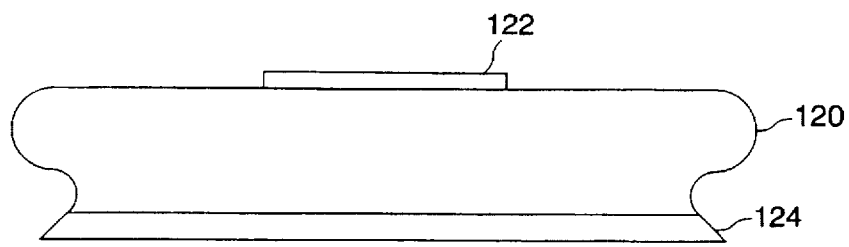
FIGS. 6A through 6C show an overall process of cutting a semiconductor wafer according to an embodiment of the present invention.
Figure 6B:
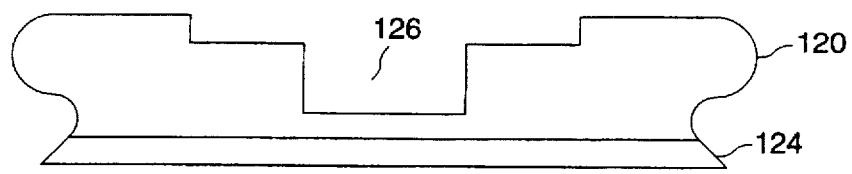
Figure 6C:
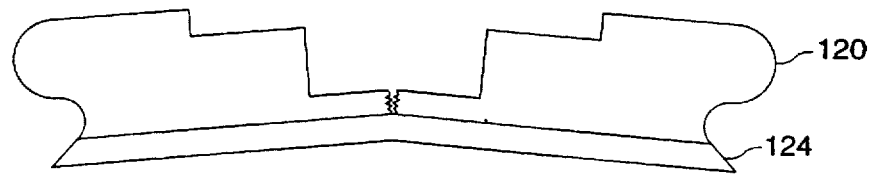

FIGS. 6A through 6C show an overall process of cutting a semiconductor wafer according to an embodiment of the present invention. In FIG. 6A, a semiconductor wafer 120 is shown. A test pattern 122 is deposited along the scribe line of the semiconductor wafer and a mounting tape 124 is applied to the underside of the semiconductor wafer.

FIG. 6B shows semiconductor wafer 120 partially severed according the method shown in FIGS. 2A–2D. The partially severing cut leaves a groove 126. In FIG. 6C, the semiconductor wafer is broken along the scribe line.

The above description of the embodiments of the invention is intended as illustrative rather than inclusive. Modification of the invention as to number of cuts, surface of the saw blade, depth of the cuts, and cutting speed is likely and such modifications are still within the intended scope of protection of the invention which is defined by the following appended claims.

What is claimed is:

1. A method of cutting a semiconductor wafer along a scribe line with a saw blade, said scribe line located on the top surface of said wafer, comprising the steps of:

providing said wafer with a test pattern deposited along said scribe line;

making at least one scribing cut into the top surface of said wafer along the scribe line and through a portion of said test pattern so that the width of said test pattern remaining is not greater than the thickness of said saw blade; and making a severing cut along the scribe line and through the remaining test pattern to remove the remaining test pattern and to at least partially sever said wafer.

2. The method of claim 1 wherein the scribing and severing cuts into said wafer are made at substantially perpendicular angles to the top surface of said semiconductor wafer.

3. The method of claim 1 wherein said severing cut partially severs said semiconductor wafer.

4. The method of claim 3 further comprising the step of breaking said semiconductor wafer along said severing cut.

5. The method of claim 1 further comprising the step of providing mounting tape on a bottom surface of said semiconductor wafer.

6. The method of claim 5 wherein said severing cut severs said semiconductor wafer without severing said mounting tape.

7. The method of claim 1 wherein said at least one scribing cut comprises the steps of:

making a first scribing cut along one side of said scribe line; and making a second scribing cut along the other side of said scribe line.

* * * * *